United States Patent
You et al.

(10) Patent No.: US 9,907,161 B2
(45) Date of Patent: Feb. 27, 2018

(54) SUBSTRATE STRUCTURE AND FABRICATION METHOD THEREOF

(71) Applicant: Siliconware Precision Industries Co., Ltd., Taichung (TW)

(72) Inventors: Jin-Wei You, Taichung (TW); Chun-Lung Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/833,101

(22) Filed: Aug. 23, 2015

(65) Prior Publication Data
US 2016/0128184 A1  May 5, 2016

(30) Foreign Application Priority Data

Oct. 29, 2014 (TW) .............................. 103137357 A

(51) Int. Cl.
| | |
|---|---|
| H05K 1/00 | (2006.01) |
| H05K 1/02 | (2006.01) |
| H05K 3/00 | (2006.01) |
| H05K 3/46 | (2006.01) |
| H05K 3/18 | (2006.01) |

(52) U.S. Cl.
CPC ........... *H05K 1/0271* (2013.01); *H05K 3/007* (2013.01); *H05K 3/4682* (2013.01); *H05K 3/184* (2013.01); *H05K 2201/0187* (2013.01); *H05K 2201/096* (2013.01); *H05K 2203/0709* (2013.01)

(58) Field of Classification Search
CPC ... H05K 2201/2018; H05K 2201/2009; H05K 1/0271; H05K 2201/09136; H05K 2201/09781; H05K 2201/09409

USPC ........ 174/250, 251, 255, 261, 262, 264, 263
See application file for complete search history.

(56) References Cited

U.S. PATENT DOCUMENTS

| | | | | |
|---|---|---|---|---|
| 6,317,331 | B1* | 11/2001 | Kamath | H01L 23/3735 174/250 |
| 6,944,945 | B1* | 9/2005 | Shipley | H05K 3/465 174/262 |
| 2004/0065473 | A1* | 4/2004 | Chang | H01L 23/145 174/261 |
| 2006/0207088 | A1* | 9/2006 | Yamano | H01L 21/6835 29/831 |
| 2008/0052905 | A1* | 3/2008 | Watanabe | H05K 3/0014 29/846 |
| 2008/0096310 | A1* | 4/2008 | Modi | H01L 23/15 438/106 |
| 2008/0308311 | A1* | 12/2008 | Kodama | G02B 6/42 174/260 |
| 2009/0139751 | A1* | 6/2009 | Sunohara | H01L 23/49833 174/255 |

(Continued)

*Primary Examiner* — Steven T Sawyer
(74) *Attorney, Agent, or Firm* — Mintz Levin Cohn Ferris Glovsky and Popeo, P.C.; Peter F. Corless; Steven M. Jensen

(57) ABSTRACT

A method for fabricating a substrate structure is provided, which includes the steps of: disposing at least a strengthening member on a carrier; sequentially forming a first circuit layer and a dielectric layer on the carrier, wherein the strengthening member is embedded in the dielectric layer; forming a second circuit layer on the dielectric layer; removing the carrier; and forming an insulating layer on the first circuit layer and the second circuit layer. The strengthening member facilitates to reduce thermal warping of the substrate structure.

5 Claims, 6 Drawing Sheets

(56) References Cited

U.S. PATENT DOCUMENTS

| | | | | |
|---|---|---|---|---|
| 2011/0061922 A1* | 3/2011 | Lee | ............................ | H01L 23/13 |
| | | | | 174/261 |
| 2013/0256022 A1* | 10/2013 | Kobayashi | ............ | H05K 1/0271 |
| | | | | 174/260 |
| 2013/0292830 A1* | 11/2013 | Liang | .................. | G06F 17/5068 |
| | | | | 257/738 |
| 2014/0020945 A1* | 1/2014 | Hurwitz | ................ | H05K 1/0271 |
| | | | | 174/262 |
| 2015/0115469 A1* | 4/2015 | Lee | .................... | H01L 23/49822 |
| | | | | 257/774 |
| 2015/0245484 A1* | 8/2015 | Ryu | ...................... | H05K 1/0271 |
| | | | | 174/262 |

* cited by examiner

SUBSTRATE STRUCTURE AND FABRICATION METHOD THEREOF

CROSS-REFERENCES TO RELATED APPLICATIONS

This application claims under 35 U.S.C. § 119(a) the benefit of Taiwanese Application No. 103137357, filed Oct. 29, 2014 the entire contents of which are incorporated herein by reference.

BACKGROUND OF THE INVENTION

1. Field of the Invention

The present invention relates to substrate structures and fabrication methods thereof, and more particularly, to a substrate structure and a fabrication method thereof for reducing thermal warping.

2. Description of Related Art

Along with the rapid development of electronic industries, electronic products are required to be reduced in thickness, and accordingly thin type substrates are needed.

FIGS. 1A to 1G are schematic cross-sectional views showing a method for fabricating a substrate structure according to the prior art.

Referring to FIG. 1A, a carrier 10 is provided and a seed layer 11 is formed on opposite surfaces of the carrier 10.

Referring to FIG. 1B, a patterned resist layer 12 having a plurality of openings is formed on the seed layer 11. Thereafter, a first circuit layer 13 is formed in the openings of the patterned resist layer 12 by electroplating.

Referring to FIG. 1C, the patterned resist layer 12 is removed.

Referring to FIG. 1D, a dielectric layer 14 is formed on the carrier 10 and the first circuit layer 13.

Referring to FIG. 1E, a plurality of openings are formed in the dielectric layer 14. Then, a second circuit layer 15 is formed on the dielectric layer 14, and a plurality of conductive vias 15a are formed in the openings of the dielectric layer 14 and electrically connecting the first circuit layer 13 and the second circuit layer 15.

Referring to FIG. 1F, the carrier 10 and the seed layer 11 are removed to expose the first circuit layer 13.

Referring to FIG. 1G an insulating layer 16 made of, for example, solder mask is formed on opposite surfaces of the dielectric layer 14. As such, a substrate structure 1 is obtained.

Through the above-described method, a thin type substrate structure is obtained. However, when the substrate structure is bonded with a chip and subjected to a molding process for forming a package structure, thermal warping easily occurs to the substrate structure. On the other hand, the molding compound generally has a thickness too small (for example, less than 0.5 mm) to overcome or balance thermal warping stresses, thus leading to warping of the overall package structure.

Therefore, there is a need to provide a substrate structure and a fabrication method thereof so as to overcome the above-described drawbacks.

SUMMARY OF THE INVENTION

In view of the above-described drawbacks, the present invention provides a method for fabricating a substrate structure, which comprises the steps of: disposing at least a strengthening member on a carrier and forming a first circuit layer on the carrier; forming a dielectric layer on the carrier, the strengthening member and the first circuit layer; forming a second circuit layer on the dielectric layer, wherein the second circuit layer is electrically connected to the first circuit layer; removing the carrier to expose the first circuit layer; and forming an insulating layer on the first circuit layer and the second circuit layer, wherein the insulating layer has a plurality of openings exposing portions of the first circuit layer and the second circuit layer.

The present invention further provides a substrate structure, which comprises: a dielectric layer having opposite first and second surfaces; a first circuit layer formed on the first surface of the dielectric layer; a second circuit layer formed on the second surface of the dielectric layer and electrically connected to the first circuit layer; at least a strengthening member embedded in the dielectric layer; and an insulating layer formed on the dielectric layer, the first circuit layer and the second circuit layer and having a plurality of openings exposing portions of the first circuit layer and the second circuit layer.

Therefore, by embedding the strengthening member in the dielectric layer, the present invention strengthens the substrate structure and also reduces variation in size of the dielectric layer per unit of temperature variation. As such, the present invention reduces thermal warping of the substrate structure.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2H are schematic cross-sectional views showing a method for fabricating a substrate structure according to the present invention.

Figure 1A:
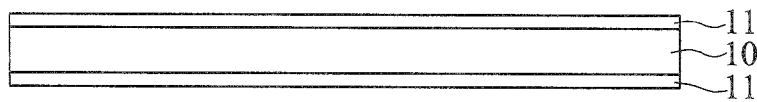
FIGS. 1A to 1G are schematic cross-sectional views showing a method for fabricating a substrate structure according to the prior art.
Figure 1B:
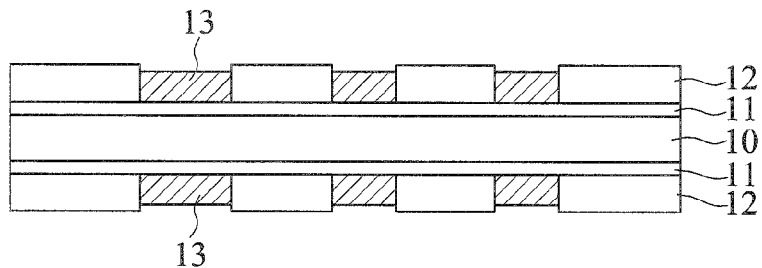
Figure 1C:
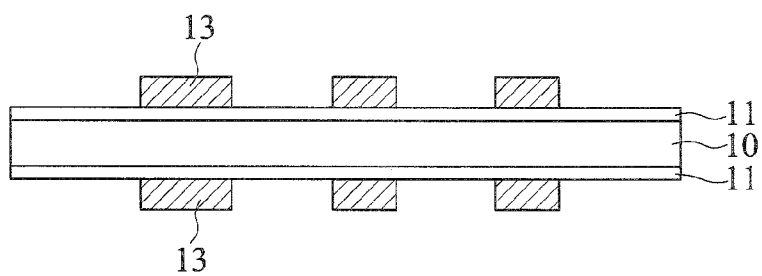
Figure 1D:
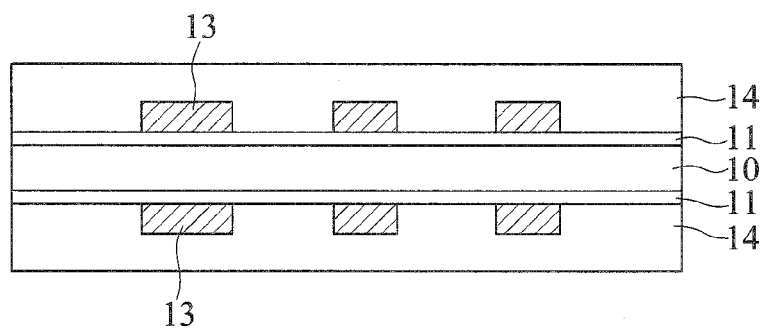
Figure 1E:
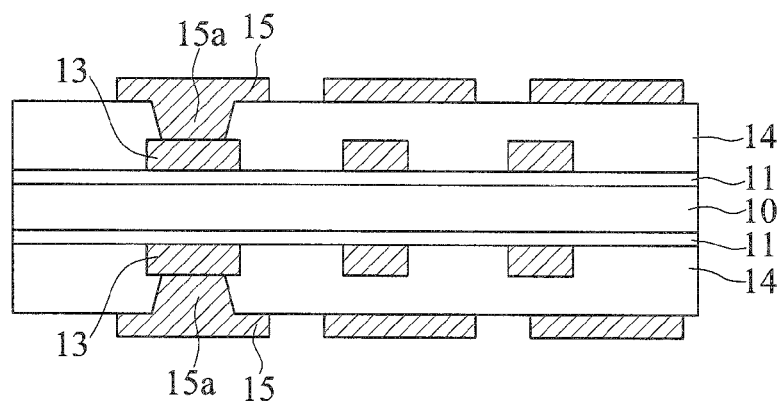
Figure 1F:
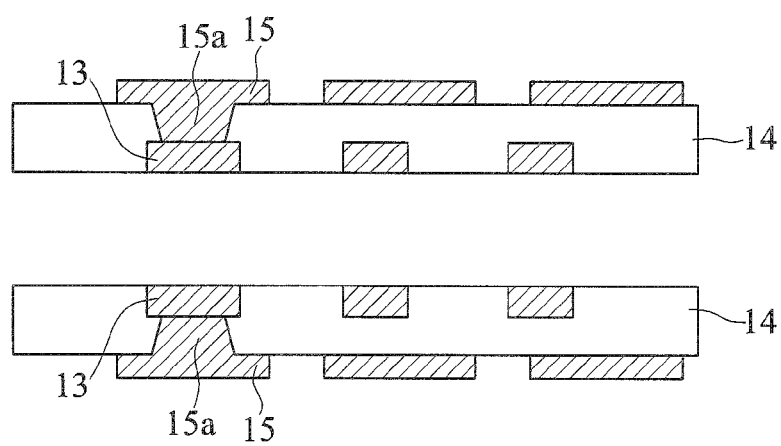
Figure 1G:
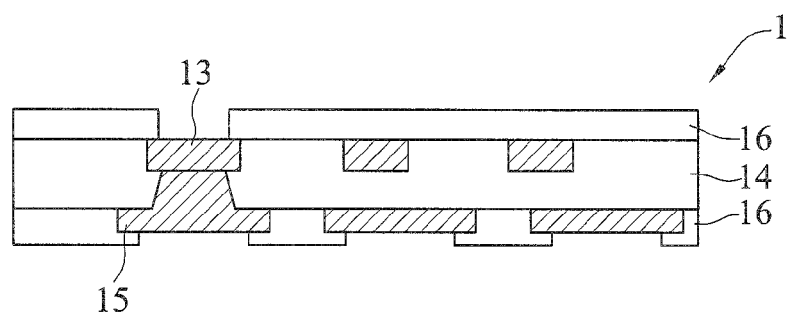
Figure 2A:
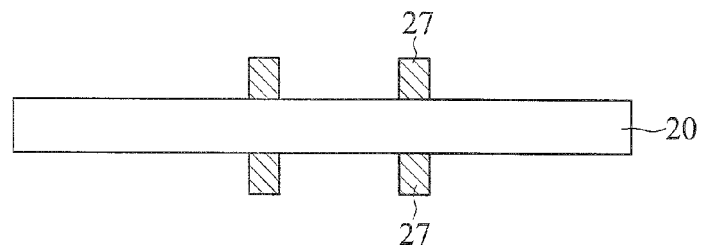
FIGS. 2A to 2H are schematic cross-sectional views showing a method for fabricating a substrate structure according to the present invention.

Referring to FIG. 2A, a carrier 20 having opposite first and second surfaces is provided and at least a strengthening member 27 is disposed on the first and second surfaces of the carrier 20. The strengthening member 27 can be made of a laminating compound or an injection molding compound. Alternatively, the strengthening member 27 can be made of a metal material such as copper, or an organic material having high strength, for example, an ABS (acrylonitrile-butadiene-styrene) resin. The organic material has a tensile strength greater than 3200 kg/mm$^2$ and a coefficient of thermal expansion less than 5 ppm/deg.

Figure 2B:
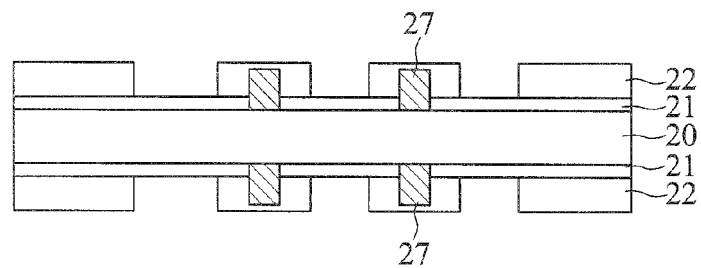

Referring to FIG. 2B, a seed layer 21 is formed on the first and second surfaces of the carrier 20. Then, a patterned resist layer 22 is formed on the seed layer 21 and covers the strengthening member 27. The patterned resist layer 22 has a plurality of openings exposing portions of the seed layer 21. In the present embodiment, the seed layer 21 is made of, for example, copper and formed by electroless plating or sputtering.

Figure 2C:
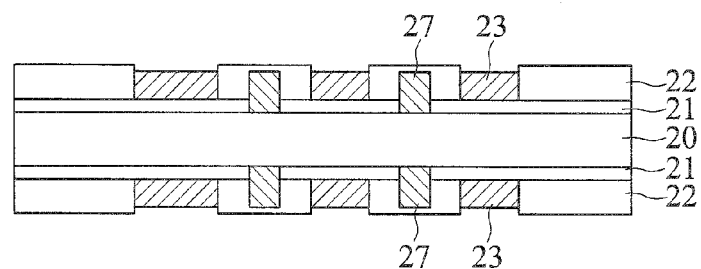

Referring to FIG. 2C, a first circuit layer 23 is formed on the exposed portions of the seed layer 21 by, for example, electroplating.

Figure 2D:
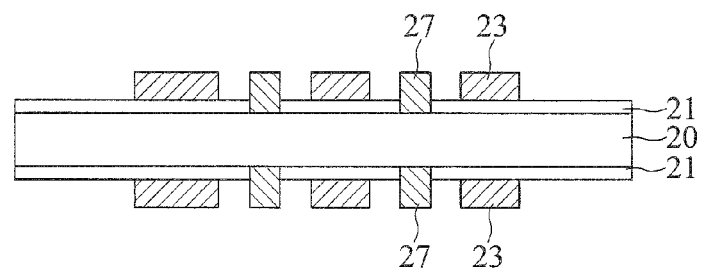

Referring to FIG. 2D, the patterned resist layer 22 is removed.

Figure 2E:
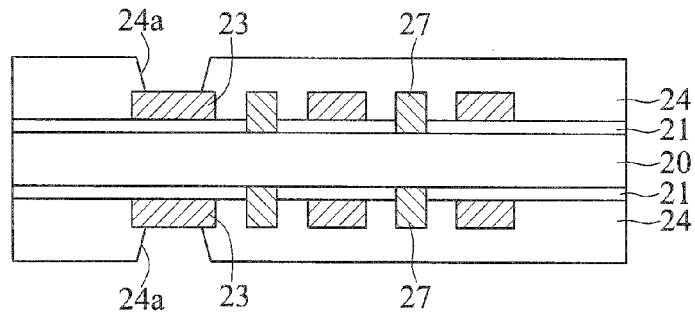

Referring to FIG. 2E, a dielectric layer 24 is formed to cover the first circuit layer 23, the strengthening member 27 and the seed layer 21. Further, a plurality of openings 24a are formed in the dielectric layer 24, exposing portions of the first circuit layer 23. In the present embodiment, the openings 24a are formed by laser drilling or mechanical drilling. The strengthening member 27 has higher strength than the dielectric layer 24, and the strengthening member 27 is embedded in the dielectric layer 24.

Figure 2F:
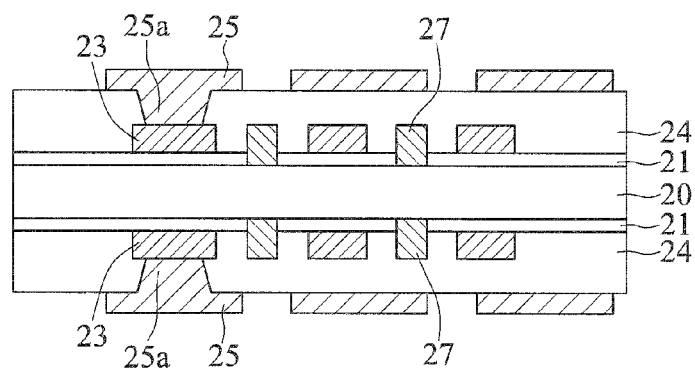

Referring to FIG. 2F, a second circuit layer 25 is formed on the dielectric layer 24, and a plurality of conductive vias 25a are formed in the openings 24a of the dielectric layer 24 and electrically connecting the second circuit layer 25 and the first circuit layer 23.

Figure 2G:
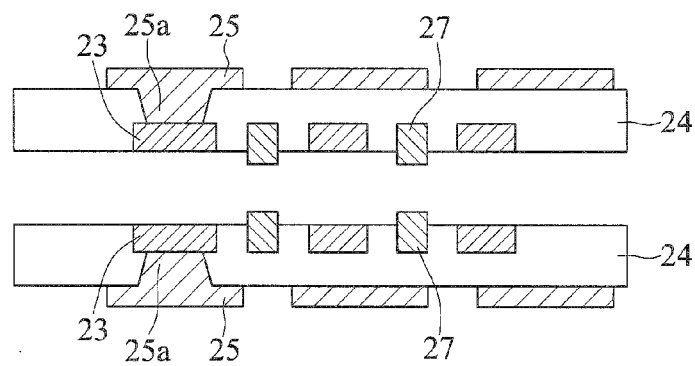

Referring to FIG. 2G, the carrier 20 and the seed layer 21 on the first and second surfaces of the carrier 20 are removed, thus exposing the first circuit layer 23 and the strengthening member 27.

Figure 2H:
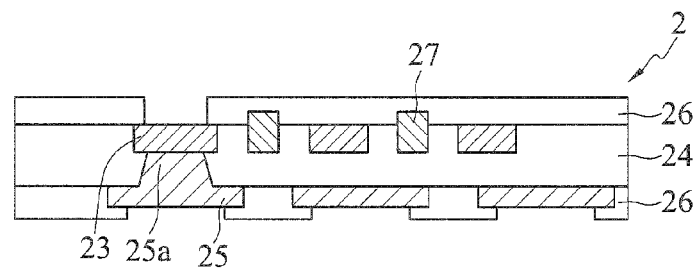

Referring to FIG. 2H, an insulating layer 26 is formed on the dielectric layer 24, the strengthening member 27, the first circuit layer 23 and the second circuit layer 25, and has a plurality of openings exposing portions of the first circuit layer 23 and the second circuit layer 25. As such, a substrate structure 2 is obtained. In the present embodiment, the insulating layer 26 is made of, for example, solder mask.

The substrate structure 2 of the present invention has: a dielectric layer 24 having opposite first and second surfaces; a first circuit layer 23 formed on the first surface of the dielectric layer 24; a second circuit layer 25 formed on the second surface of the dielectric layer 24; a plurality of conductive vias 25a formed in the dielectric layer 24 and electrically connecting the second circuit layer 25 and the first circuit layer 23; at least a strengthening member 27 embedded in the dielectric layer 24; and an insulating layer 26 formed on the dielectric layer 24, the first circuit layer 23 and the second circuit layer 25 and having a plurality of openings exposing portions of the first circuit layer 23 and the second circuit layer 25.

The insulating layer 26 can be made of solder mask.

The strengthening member 27 can be made of a laminating compound, an injection molding compound, a metal material, or an organic material having high strength, for example, an ABS (acrylonitrile-butadiene-styrene) resin.

The strengthening member 27 can have higher strength than the dielectric layer 24. The strengthening member 27 facilitates to strengthen the substrate structure so as to reduce thermal warping of the substrate structure.

Figure 3A:
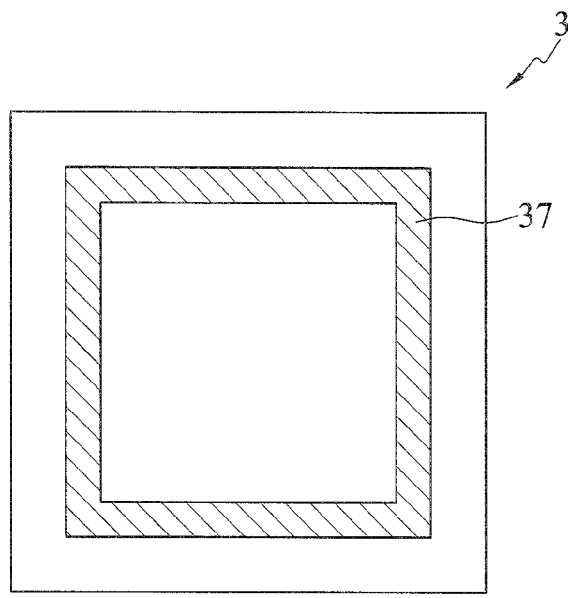
FIGS. 3A and 3B are schematic planar views of a substrate structure according to an embodiment of the present invention.
Figure 3B:
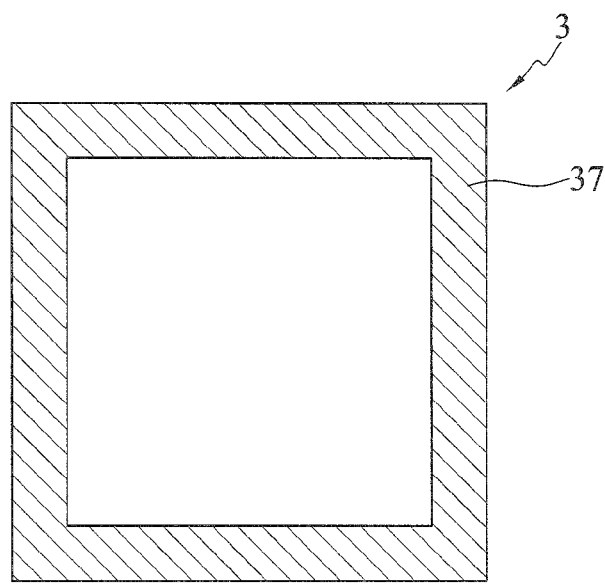

FIGS. 3A and 3B are schematic planar views of a substrate structure 3 according to an embodiment of the present invention;

Referring to FIGS. 3A and 3B, the strengthening member 37 of the substrate structure 3 has a frame structure that can be arranged inside the substrate structure 3, as shown in FIG. 3A, or arranged along an edge of the substrate structure 3, as shown in FIG. 3B. The frame structure can have, but not limited to, a rectangular shape, a circular shape or the like.

Figure 4:
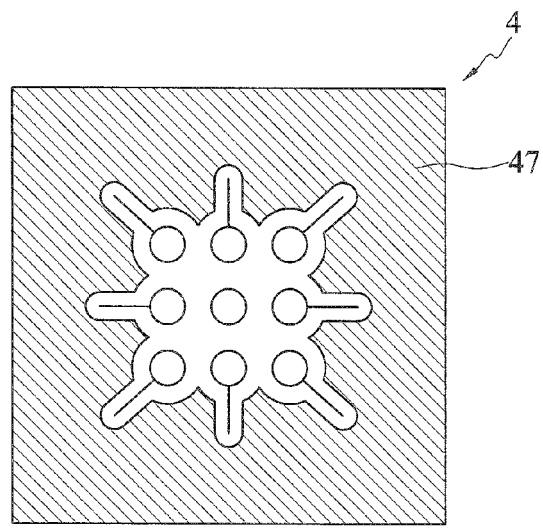
FIG. 4 is a schematic planar view of a substrate structure according to another embodiment of the present invention.

FIG. 4 is a schematic planar view of a substrate structure 4 according to another embodiment of the present invention.

Referring to FIG. 4, the strengthening member 47 of the substrate structure 4 is a copper pour that covers the dielectric layer of the substrate structure 4 except for the circuit layer.

Figure 5:
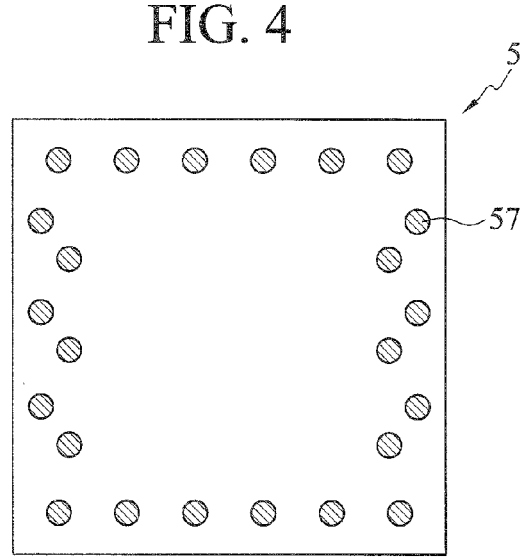
FIG. 5 is a schematic planar view of a substrate structure according to a further embodiment of the present invention.

FIG. 5 is a schematic planar view of a substrate structure 5 according to a further embodiment of the present invention.

Referring to FIG. 5, the strengthening member 57 of the substrate structure 5 consists of a plurality of columns that are distributed in the dielectric layer of the substrate structure 5 to thereby reduce variation in size of the dielectric layer per unit of temperature variation.

Figure 6:
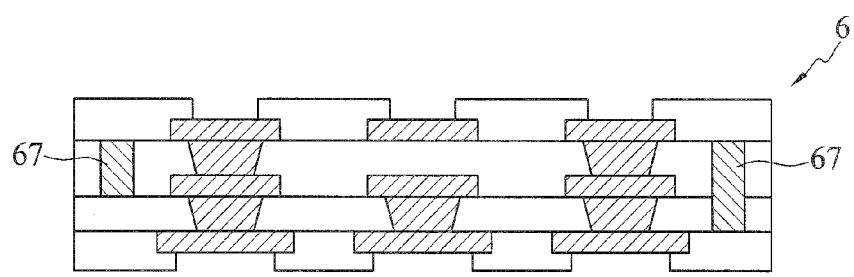
FIG. 6 is a schematic cross-sectional view of a substrate structure according to still another embodiment of the present invention.

FIG. 6 is a schematic cross-sectional view of a substrate structure 6 according to still another embodiment of the present invention.

Referring to FIG. 6, the substrate structure 6 further has at least a dielectric layer and a third circuit layer formed on the second circuit layer. The third circuit layer is electrically connected to the second circuit layer. The strengthening member 67 can be optionally located in a single dielectric layer or penetrate through multiple dielectric layers.

Therefore, by embedding the strengthening member in the dielectric layer, the present invention strengthens the substrate structure and also reduces variation in size of the dielectric layer per unit of temperature variation. As such, the present invention reduces thermal warping of the substrate structure.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A substrate structure, comprising:
    a dielectric layer having opposite first and second surfaces;
    a first circuit layer formed on the first surface of the dielectric layer and embedded in the dielectric layer;
    a second circuit layer formed on the second surface of the dielectric layer and electrically connected to the first circuit layer;
    at least a strengthening member embedded in the dielectric layer, wherein the strengthening member has a frame structure that is arranged inside the substrate structure or along an edge of the substrate structure;
    at least another dielectric layer and a third circuit layer formed on the second circuit layer, wherein the strengthening member is located in the dielectric layer or penetrates through the dielectric layer and the another dielectric layer; and
    an outermost insulating layer formed on the dielectric layer, the first circuit layer and the third circuit layer and having a plurality of openings exposing portions of the first circuit layer and the third circuit layer, wherein the strengthening member is partially embedded in the outermost insulating layer, and the outermost insulating layer and the dielectric layer are made of different materials.

2. The substrate structure of claim 1, wherein the strengthening member is made of a laminating compound, an injection molding compound, a metal material or an organic material.

3. The substrate structure of claim 1, wherein the strengthening member has higher strength than the dielectric layer.

4. The substrate structure of claim 1, wherein a plurality of conductive vias are formed in the dielectric layer and electrically connecting the first circuit layer and the second circuit layer.

5. The substrate structure of claim 1, wherein the strengthening member covers the dielectric layer except for the circuit layer.

* * * * *